(12) United States Patent
Oraa Gil et al.

(10) Patent No.: US 9,015,903 B2
(45) Date of Patent: Apr. 28, 2015

(54) PIN CONNECTOR

(71) Applicant: Hewlett-Packard Development Company, L.P., Houston, TX (US)

(72) Inventors: Inigo Oraa Gil, Guecho (ES); Carolina Cabo Parra, Berango (ES); Joseba Ormaechea Saracibar, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/032,216

(22) Filed: Sep. 20, 2013

(65) Prior Publication Data

US 2015/0084493 A1    Mar. 26, 2015

(51) Int. Cl.
*H05K 5/02*    (2006.01)
*H05K 5/03*    (2006.01)

(52) U.S. Cl.
CPC ............ *H05K 5/0226* (2013.01); *H05K 5/03* (2013.01)

(58) Field of Classification Search
CPC .......... B41J 29/02; E05D 7/10; E05D 7/1016; E05D 7/1022; E05D 7/1055; H05K 5/0226; H05K 5/03
USPC ............ 16/223, 254–259, 380, 386, DIG. 40; 400/639, 693
See application file for complete search history.

(56) References Cited

U.S. PATENT DOCUMENTS

| | | | | |
|---|---|---|---|---|
| 2,429,447 A * | 10/1947 | Apfelbaum | ..................... | 16/259 |
| 2,901,767 A * | 9/1959 | Odlum et al. | .................... | 16/259 |
| 5,016,949 A | 5/1991 | Knurr et al. | | |
| 5,881,150 A * | 3/1999 | Persson | ..................... | 379/433.13 |
| 5,926,916 A | 7/1999 | Lee et al. | | |
| 6,588,624 B1 * | 7/2003 | Connors et al. | ............... | 220/827 |
| 6,916,052 B2 | 7/2005 | Yamada et al. | | |
| 6,978,107 B2 * | 12/2005 | Nagashima et al. | .......... | 399/262 |
| 7,413,362 B2 * | 8/2008 | Bandou | .......... | 400/693 |
| 7,452,145 B2 * | 11/2008 | Kato | ............... | 400/693 |
| 7,873,303 B2 * | 1/2011 | Ohta et al. | ..................... | 399/125 |
| 8,023,859 B2 * | 9/2011 | Matsumoto | ................... | 399/110 |
| 2004/0070659 A1 * | 4/2004 | Lee | .................. | 347/108 |
| 2005/0078997 A1 * | 4/2005 | Bingham et al. | ............... | 400/679 |
| 2005/0115025 A1 * | 6/2005 | Minaguchi et al. | ............. | 16/259 |
| 2011/0242209 A1 * | 10/2011 | Yazawa | ........................... | 347/37 |
| 2012/0056941 A1 * | 3/2012 | Silverbrook et al. | ........... | 347/54 |

FOREIGN PATENT DOCUMENTS

| | | |
|---|---|---|
| JP | 10114129 | 5/1998 |
| JP | 20100197895 | 9/2010 |

OTHER PUBLICATIONS

Hafele UK Ltd; 140° Pivot Hinge, without Stop; hafele.co.uk/Hafele35a1/templates/hafele/Products.asp?param=9248&ig_id=10365; 2013.

* cited by examiner

*Primary Examiner* — William Miller

(57) ABSTRACT

In one example, a connector includes: first and second pins protruding from opposite sides of a panel or a frame; first and second receivers on opposite sides of the other of the panel or the frame to receive the first and second pins; a first distance between the receivers shorter than a second distance between the protruding ends of the pins such that the first pin may be inserted into the first receiver and then the second pin inserted into the second receiver but both pins may not be inserted simultaneously into the receivers; and a movable retainer integral to the panel and the frame to retain the pins in the receivers. The retainer is movable between a first position to limit axial travel of the pins in the receivers and a second position to not limit axial travel of the pins in the receivers.

13 Claims, 15 Drawing Sheets

PIN CONNECTOR

BACKGROUND

Some large format printers include a window that allows the user to see the print zone or other areas inside the printer housing. Often these windows are connected to the housing with hinges so the window can be opened to access components inside the printer housing.

DRAWINGS

FIGS. 1-5 illustrate one example of a new pin connector connecting a panel to a frame. FIGS. 1 and 2 are perspective views showing the panel in an open position and in the closed position, respectively. FIG. 3 shows the panel exploded away from the frame. FIGS. 4 and 5 are front and side views, respectively, showing the panel/frame assembly with the panel in an open position.

The same part numbers designate the same or similar parts throughout the figures.

DESCRIPTION

Windows in exposed parts of a printer are susceptible to damage. A new connector has been developed to simplify the process of installing a window in a printer, allowing the printer user to easily replace a damaged window—without tools and with no need for a service engineer. In one example, the new connector utilizes a spring tab to retain the windows' hinge pins in in the desired position in the window frame. As described in detail below, for installing the window, the spring tab is depressed to slide the hinge pins into the corresponding receivers on the frame. The spring tab is then released to return to its original position where it engages the pin on one end of the window to retain the pins in the correct position in the frame. For removing the window, the spring tab is depressed to slide the pins out of the receivers.

Examples of the new connector are not limited to printers, windows, or hinge pins but may be implemented in other devices and for other applications. Accordingly, the examples described herein and shown in the Figures illustrate but do not limit the invention.

Figure 1:
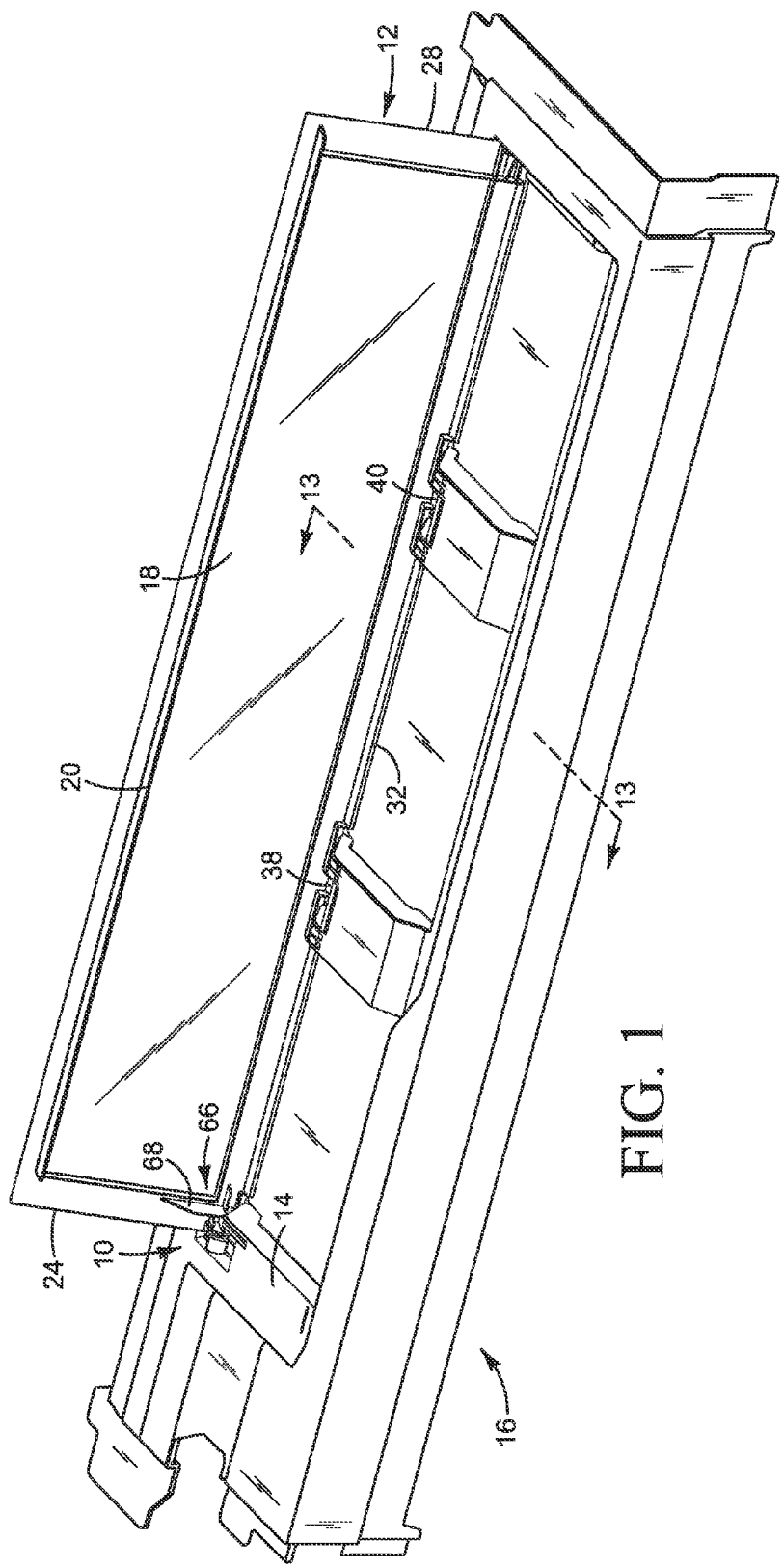
Figure 2:
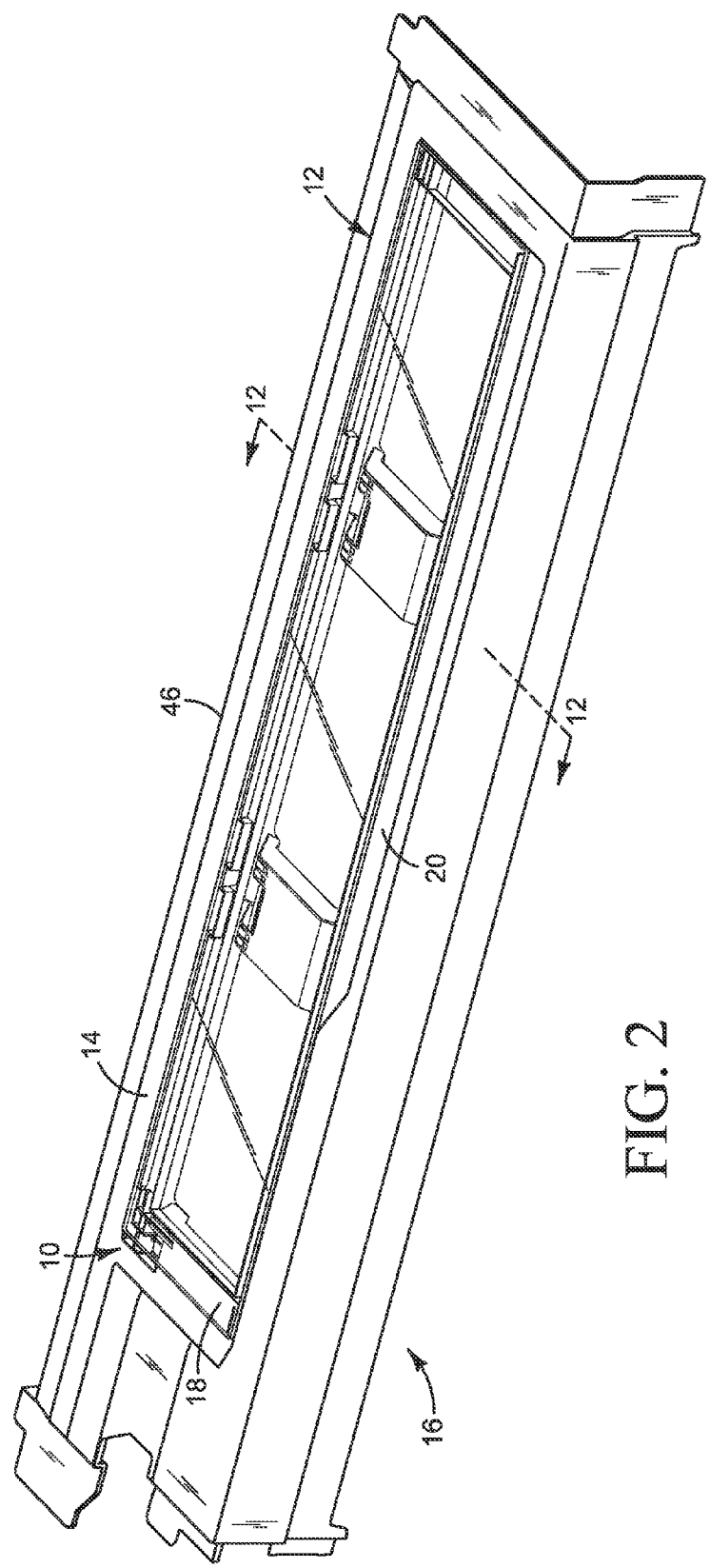
Figure 3:
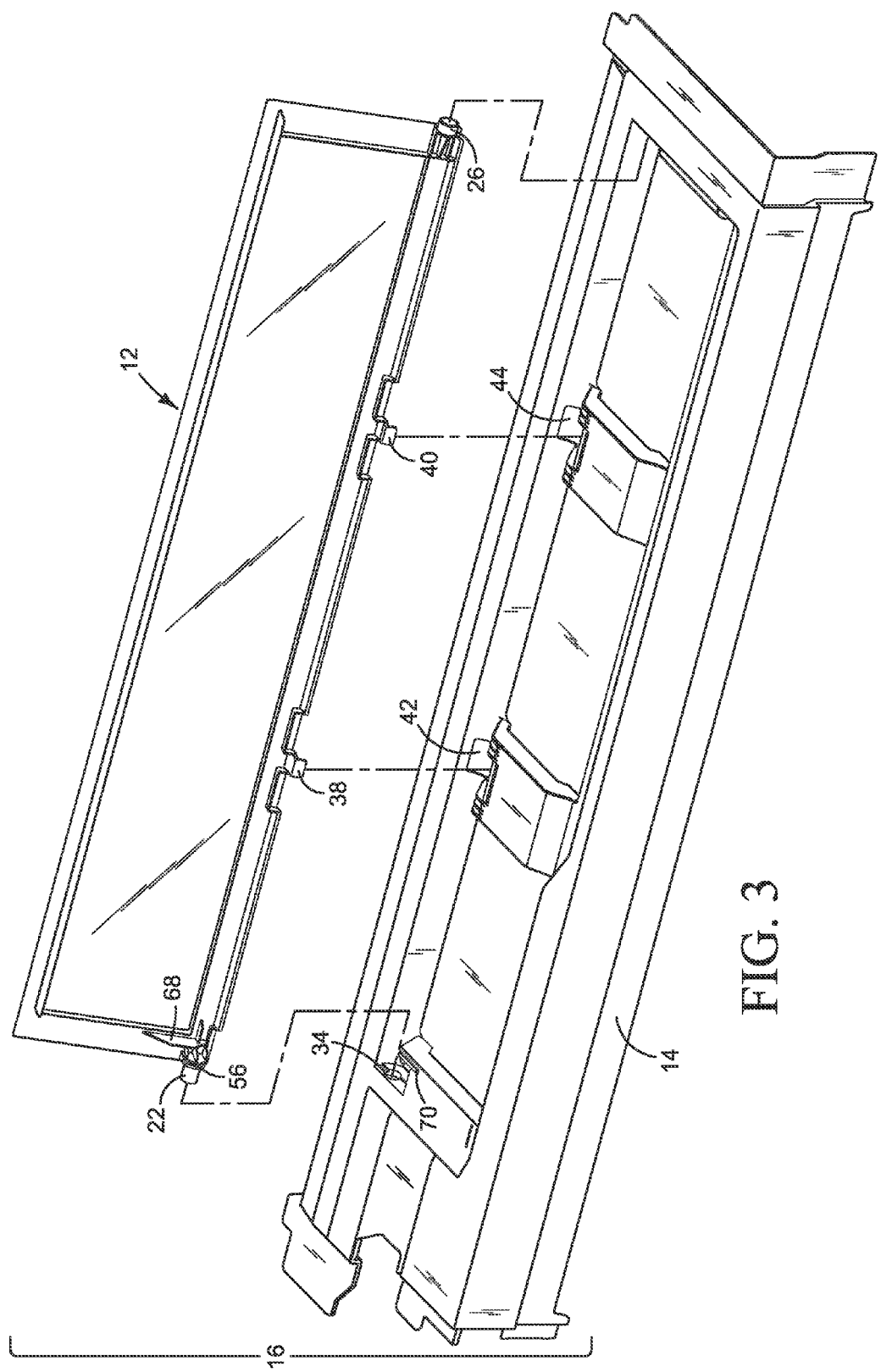
Figure 4:
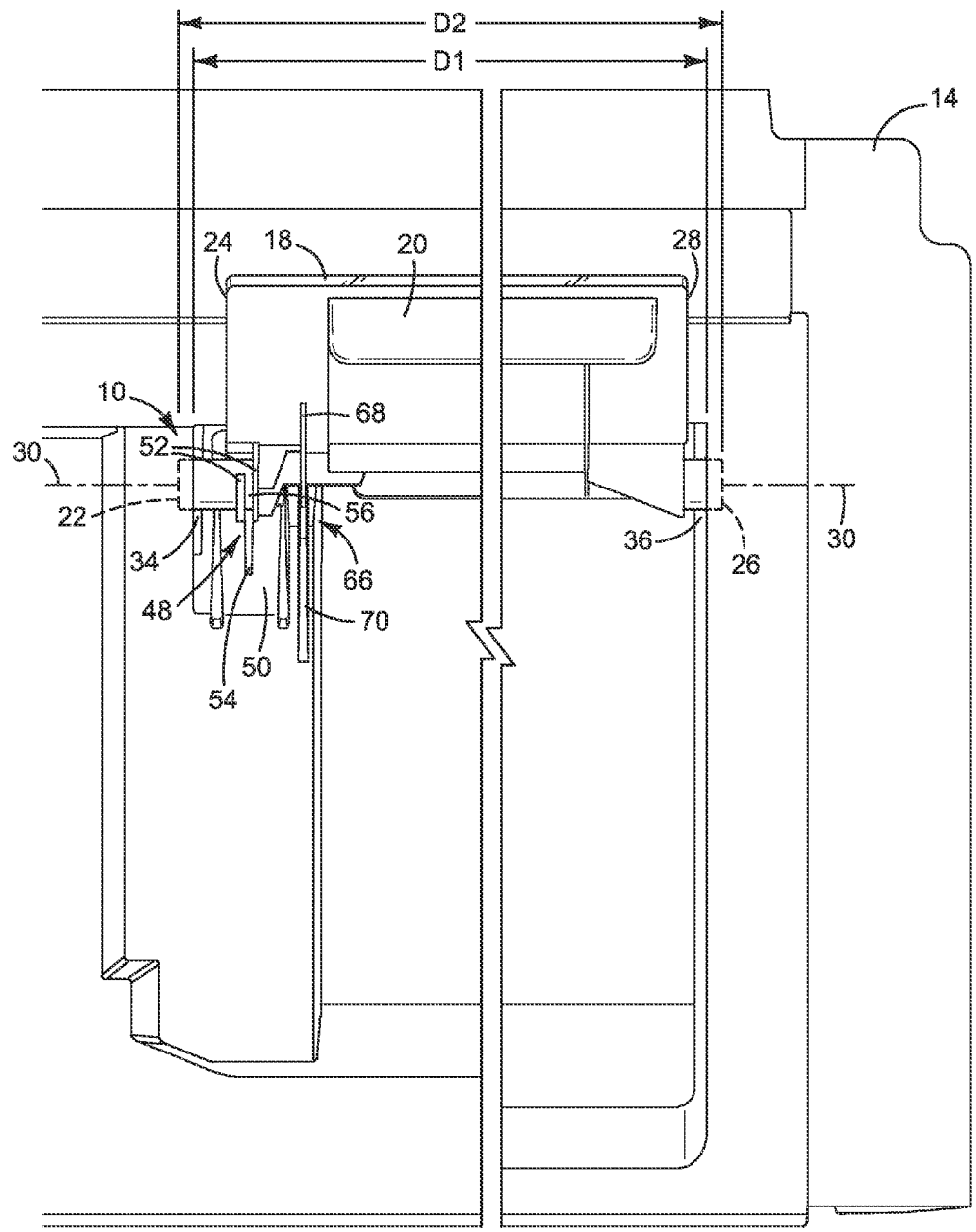
Figure 5:
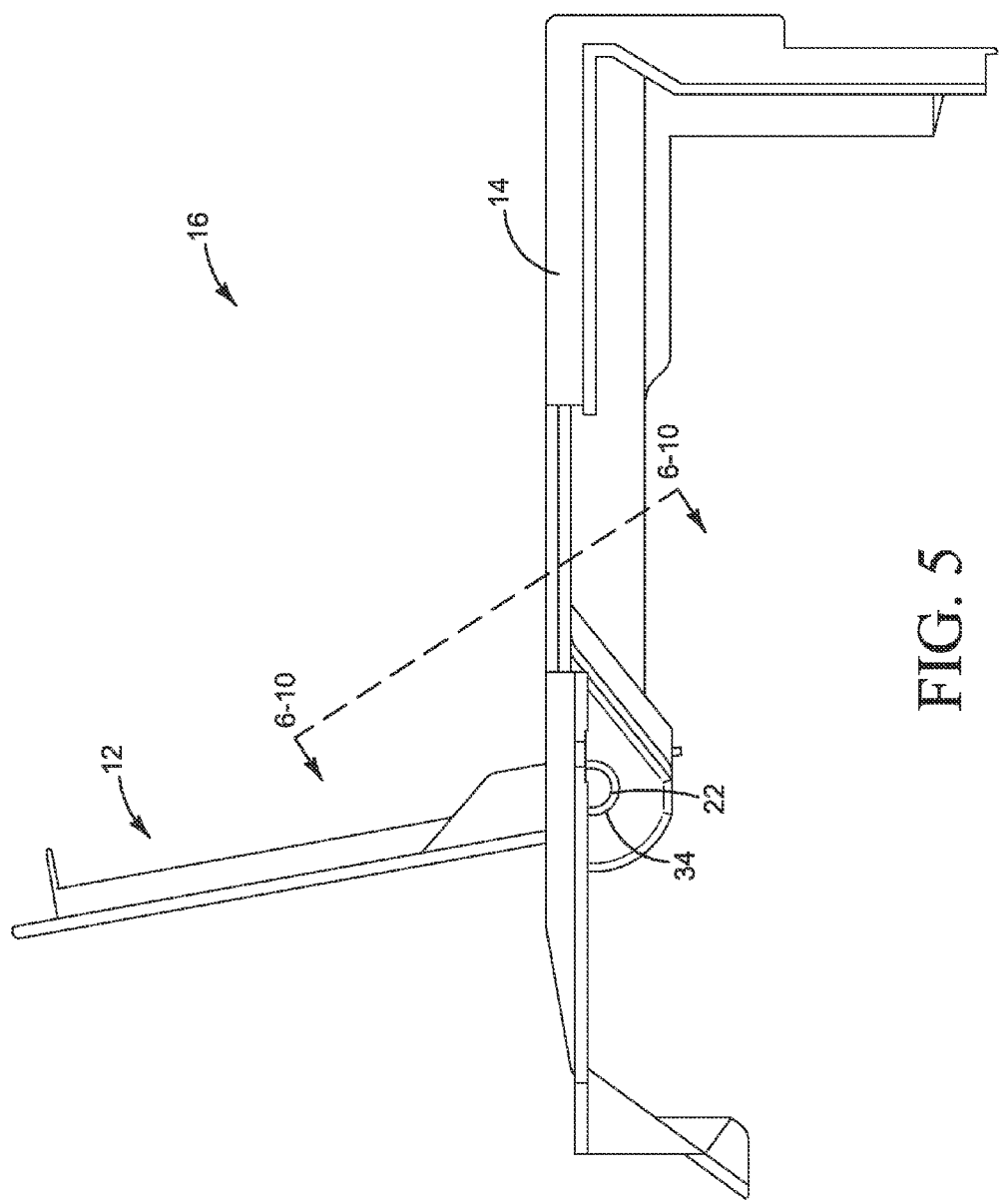

FIGS. 1-5 illustrate one example of a pin connector 10 connecting a panel 12 to a frame 14 to form an assembly 16. In this example, panel 12 is configured as a window and connector 10 makes a hinge connection to open and close the window. FIGS. 1 and 2 are perspective views showing window 12 in an open position and in the closed position, respectively. FIG. 3 shows window 12 exploded from frame 14. FIGS. 4 and 5 are front and side elevation views, respectively, showing assembly 15 with window 12 in an open position. Assembly 16 is foreshortened in the front view of FIG. 4 to better illustrate connector 10.

Referring to FIGS. 1-5, window 12 includes a pane 18 mounted in a sash 20. Sash 20, for example, is a molded plastic framework that holds one or more clear plastic or other suitable transparent panes 18. Connector 10 includes a first pin 22 protruding from a first side 24 of window sash 20 and a second pin 26 protruding from a second side 28 of sash 20 opposite first side 24. In this hinge example, connection pins 22 and 26 are aligned axially with one another on an axis of rotation 30 along a long side 32 of window 12. Connector 10 also includes first and second receivers 34 and 36 to receive and support first and second pins 22 and 26, respectively, in frame 14. A pair of alignment tabs 38, 40 on window sash 20 fit in to corresponding openings 42, 44 in frame 14 to help keep the long side 32 of window 12 aligned horizontally with the long side 46 of frame 14 when window 12 is closed.

Other configurations for panel/frame assembly 16, connector pins 22, 26 and receivers 34, 36 are possible. For example, panel 12 could be a door (with or without a window) or a stationary panel and, for a non-hinge connector 10, the pins 22, 26 need not be aligned axially and need not be round. For other examples, the pins 22, 26 could be located on the frame and the receivers located on the panel, or one pin and one receiver located on the frame and the other pin and receiver on the panel.

As best seen in FIG. 4, the distance D1 between receivers 34 and 36 is shorter than the distance D2 between the protruding ends of pins 22 and 26 such that first pin 22 may be inserted into first receiver 34 and then second pin 26 inserted into second receiver 36 but both pins 22, 26 may not be inserted simultaneously into receivers 34, 36. A retainer 48 keeps pins 22, 26 in receivers 34, 36. Retainer 48 is integral to window 12 and frame 14. As used in this document, "integral to" means formed together as a single unit or otherwise combined in a way designed to not require that any part of the retainer be added to the frame or to the window to retain the parts or be removed from the frame or the window to not retain the parts. Thus, in the example shown, retainer 48 includes a spring tab 50 molded or otherwise formed together as a single unit with frame 14 and a collar 52 molded or otherwise formed together as a single unit with first pin 22. Spring tab 50 and/or collar 52 might also be configured as separate parts affixed to frame 14 and pin 22, respectively, for example with an adhesive or with a mechanical fastener. A bump 54 on spring tab 50 fits into a groove 56 in collar 52 to retain pin 22, and thus window 12, in the correct position axially in frame 14. With this configuration, window 12 may be easily installed in frame 14 without bending and without tools, as described in detail below.

Figure 6:
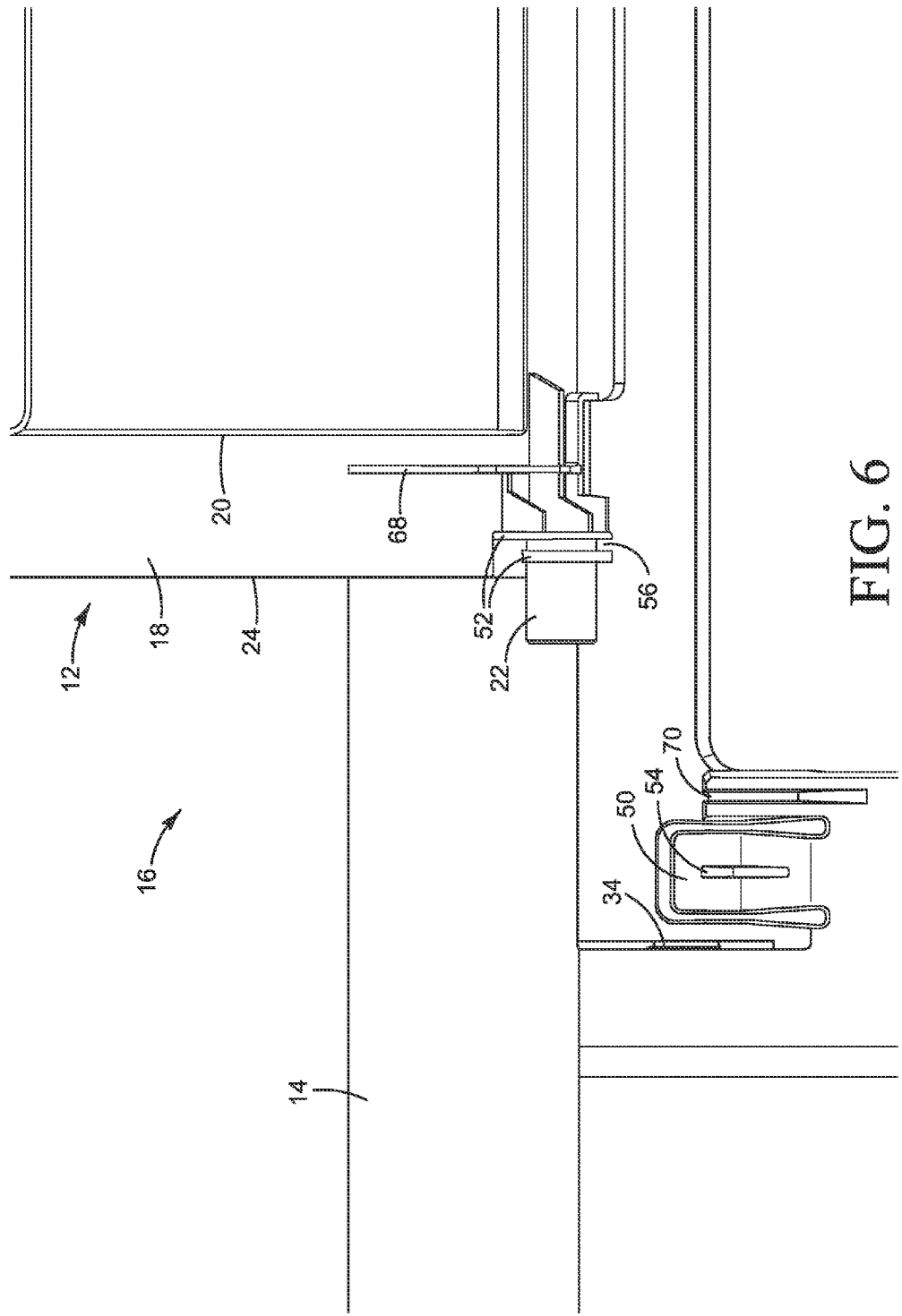
FIGS. 6-10 are detail views showing one example sequence for connecting the panel to the frame in the assembly shown in FIGS. 1-5. The view angle of FIGS. 6-10 is taken along the line 6-10/6-10 in FIG. 5.
Figure 7:
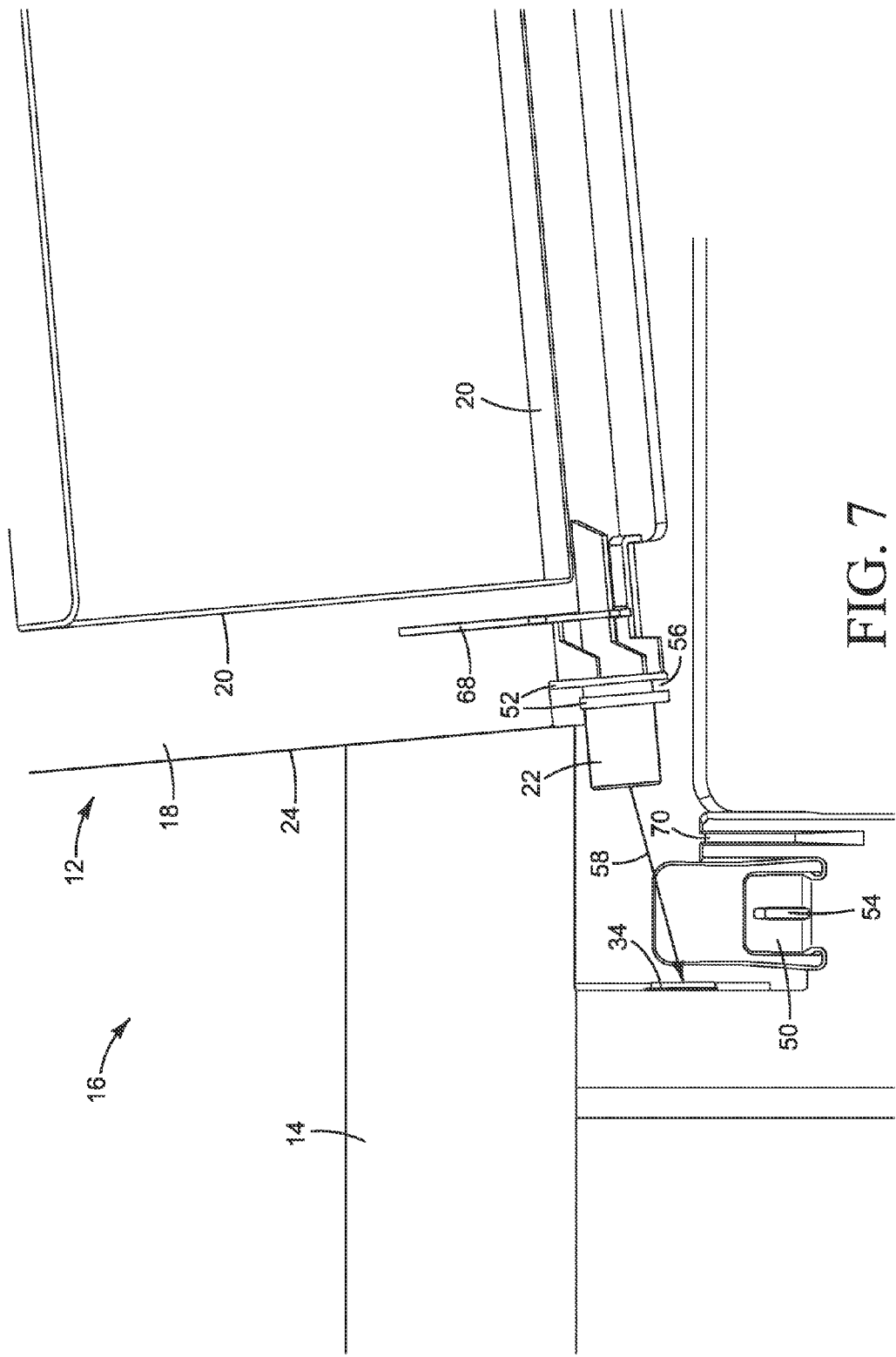
Figure 8:
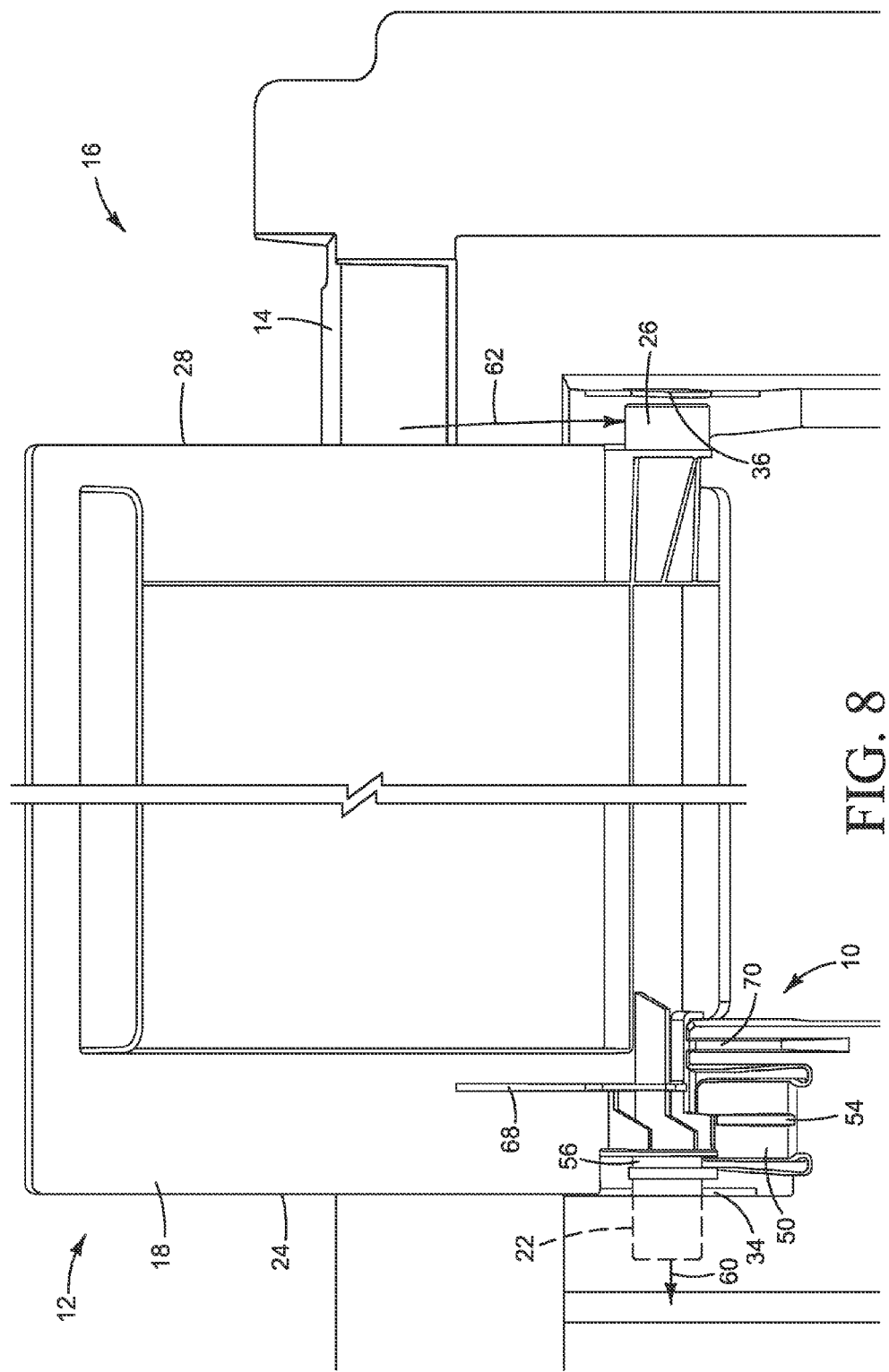
Figure 9:
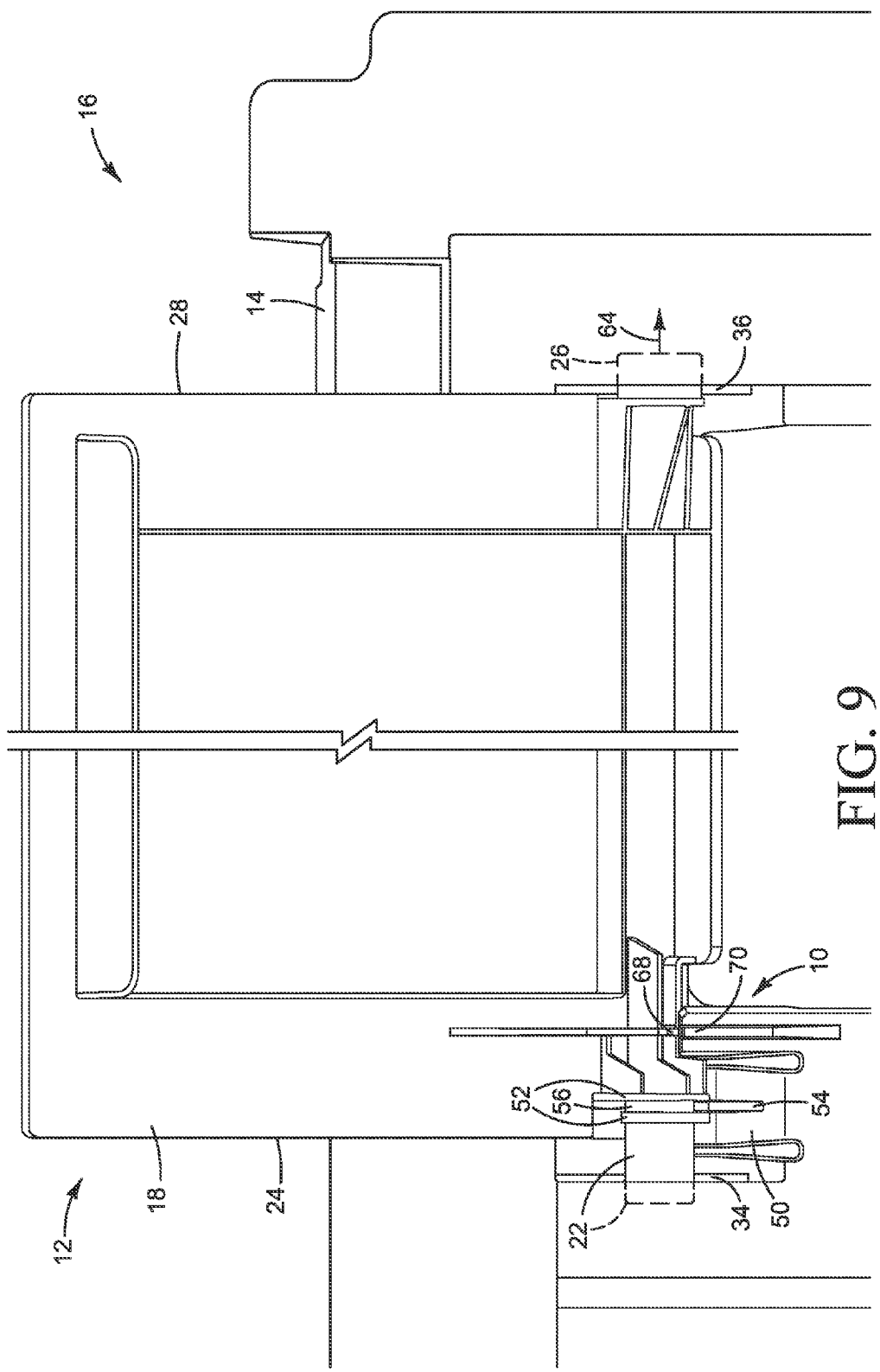

Installation of window 12 in frame 14 is described with reference to the details views of FIGS. 6-10. The view angle of FIGS. 6-10 is taken along the line 6-10/6-10 in FIG. 5. Referring first to FIGS. 6 and 7, spring tab 50 is depressed, as best seen by comparing FIGS. 6 and 7, and window 12 tilted to allow first pin 22 to slide into first receiver 34, as indicated by arrow 58 in FIG. 7. Referring to FIG. 8, first pin 22 is moved far enough into first receiver 34 until the second side 28 of window 12 can be rotated down to align second pin 26 with second receiver 36, as indicated by arrows 60 and 62 in FIG. 8. Then, with spring tab 50 still depressed, window 12 is moved to the right until second pin 26 is supported in second receiver 36 and the bump 54 on spring tab 50 is aligned with the groove 56 in collar 52, as indicated by arrow 64 in FIG. 9. Spring tab 50 is then released to return to the closed position shown in FIG. 9, with bump 54 in groove 56 to limit the axial travel of pins 22, 26 in receivers 34, 36 and retain window 12 in frame 14. This sequence is reversed to remove window 12 from frame 14.

Figure 10:
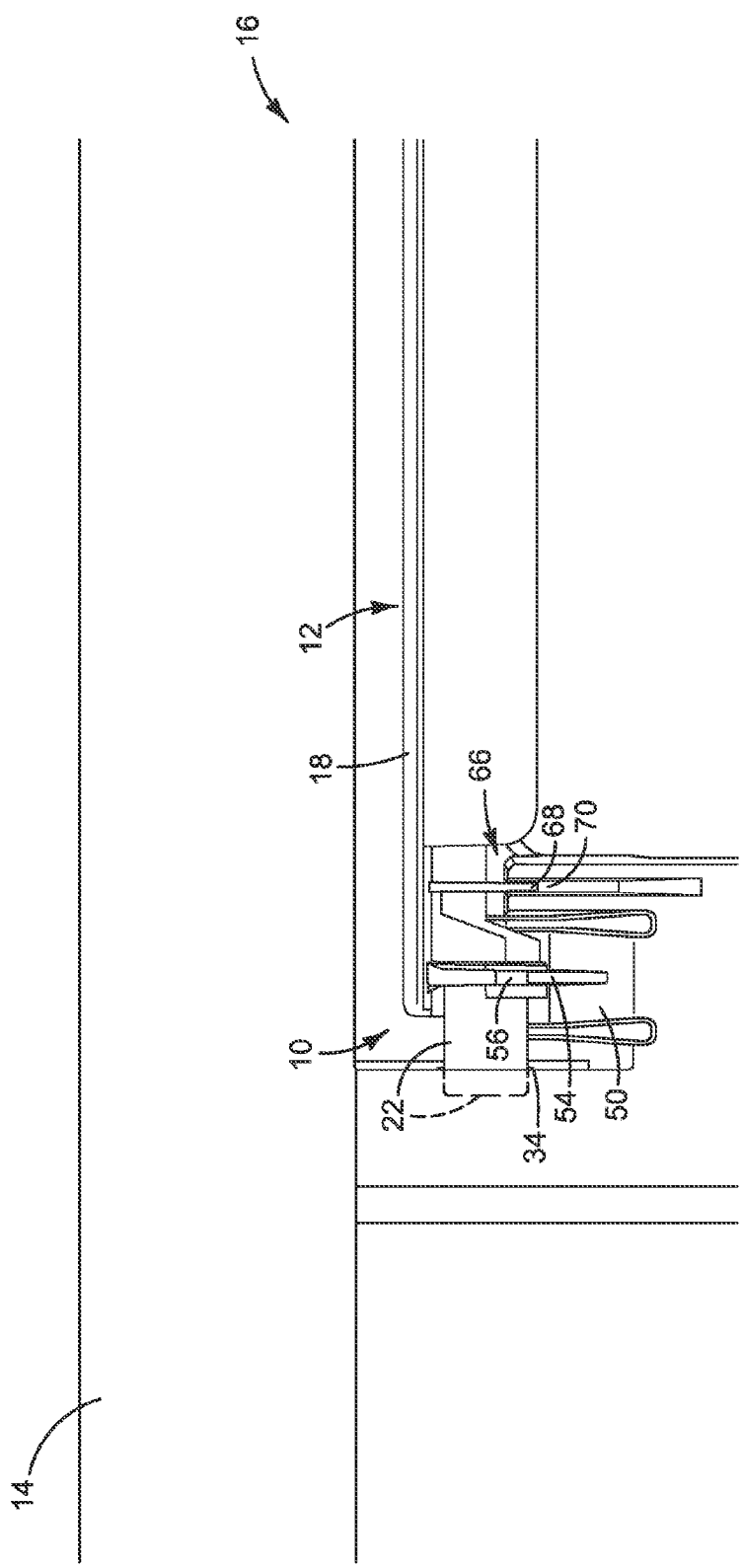
Figure 11:
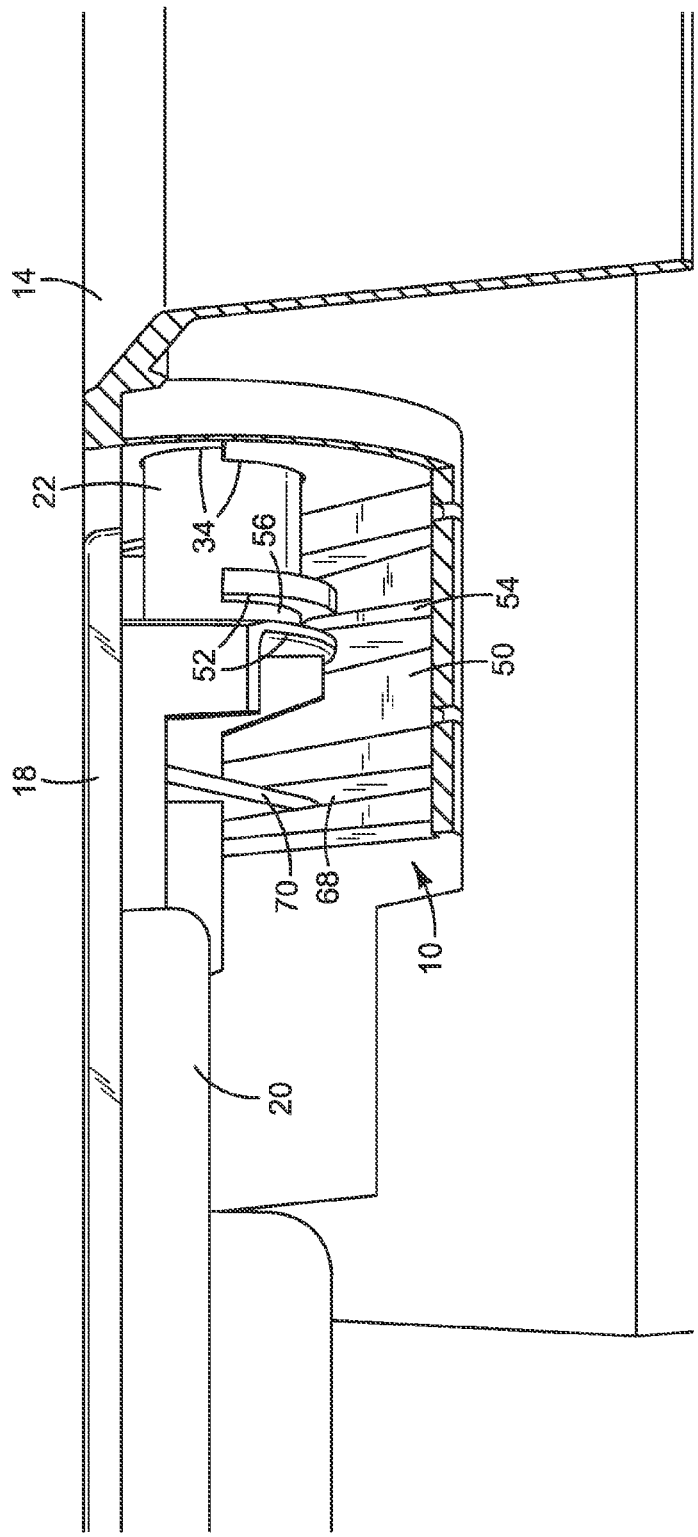
FIG. 11 is a cut-away perspective of one end of the connector shown in FIGS. 1-10 viewed from the back of the panel/frame assembly.

FIG. 4 shows retainer 48 engaged with window 12 open. FIGS. 10 and 11 show retainer 48 engaged with window 12 closed. FIG. 10 is a front view like FIG. 4 taken along the line 6-10/6-10 in FIG. 5. FIG. 11 is a cut-away perspective looking in from the back at retainer 48. Referring to FIGS. 4, 10, and 11, collar 52 and thus groove 56 extends around the circumference of circular first pin 22 through the full range of travel of window 12. Accordingly, retainer 48 will retain window 12 in frame 14 in the closed position and in all open positions. Also, as best seen in FIG. 2, spring tab 50 is not accessible to disengage retainer 48 when window 12 is closed.

Although bump 54 in groove 56 helps keep window 12 aligned to frame 14 during opening and closing, for a hinged connector 10 with a comparatively large panel 12, it may be desirable to include a second, more robust alignment feature. Accordingly, and referring to FIGS. 1 and 3, assembly 16 also includes an alignment feature 66 with a fin 68 projecting from window sash 20 into a guide slot 70 in frame 14. Fin 68 travels in slot 70 from the window closed position shown in FIGS. 10 and 11 through window open positions until the fully open position shown in FIGS. 1 and 8 where fin 68 clears slot 70 to allow installing and removing window 12 as described above.

Figure 12:
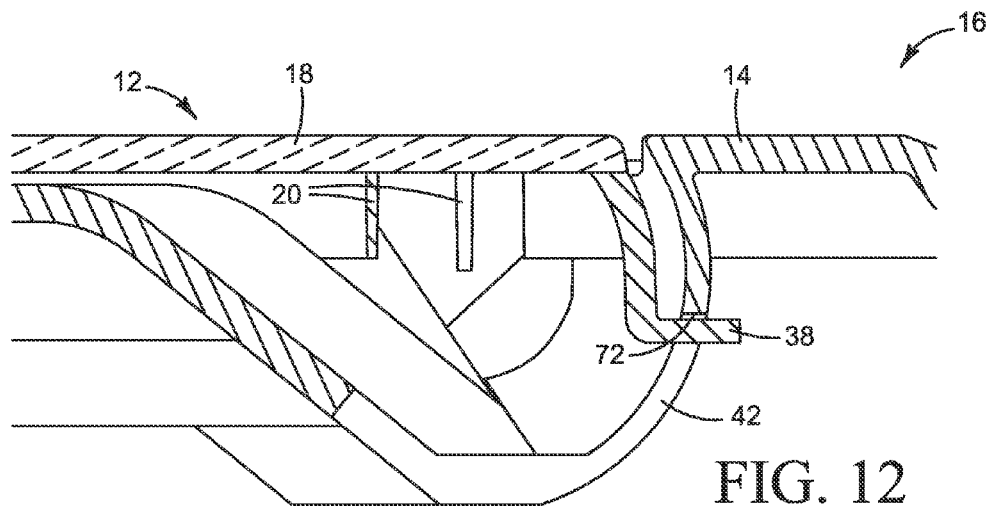
FIG. 12 is a section view taken along the line 12-12 in FIG. 2.
Figure 13:
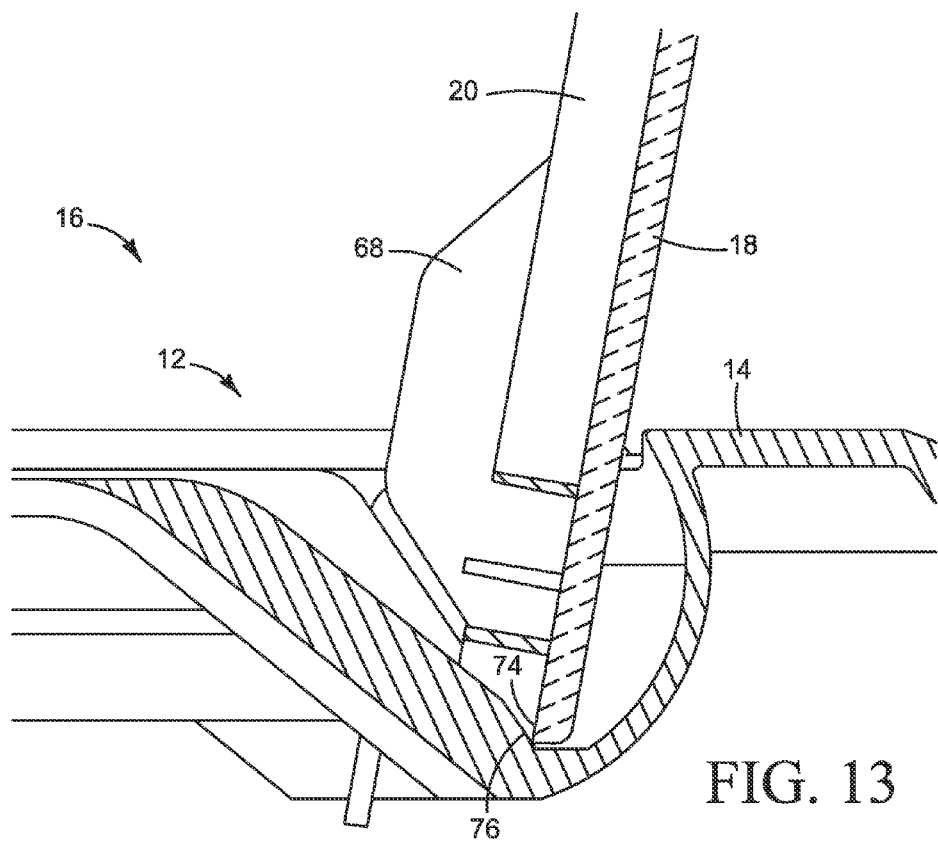
FIG. 13 is a section view taken along the line 13-13 in FIG. 1.

FIG. 12 is a section view taken along the line 12-12 in FIG. 2 showing one of the alignment tabs 38, 40 on window sash 20 with window 12 closed. (Alignment tabs 38, 40 are shown in FIGS. 1-3.) Referring to FIG. 12, when window 12 is closed, each tab 38, 40 abuts or nearly abuts a stop 72 on frame 14 to keep the long side 32 of window 12 aligned horizontally to frame 14 by preventing long side 32 from deforming up, above frame 14. FIG. 13 is a section view taken along the line 13-13 in FIG. 1. Referring to FIG. 13, the outside edge 74 of the long side 32 of window 12 abuts a stop 76 on frame 14 to stop the rotation of window 12 at the desired position for the fully open position.

Figure 14:
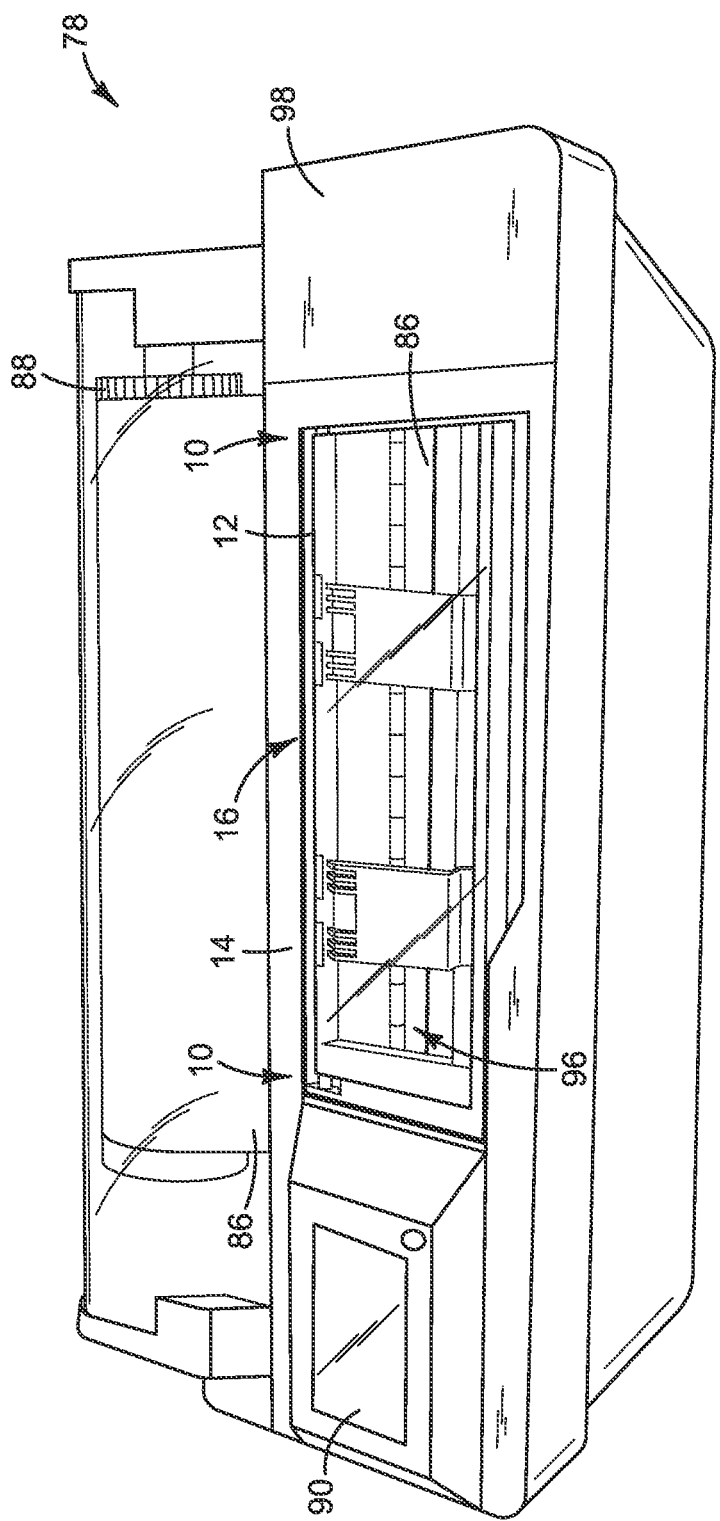
FIGS. 14-16 illustrate one example of a printer implementing a panel/frame assembly such as the one shown in FIGS. 1-13.
Figure 15:
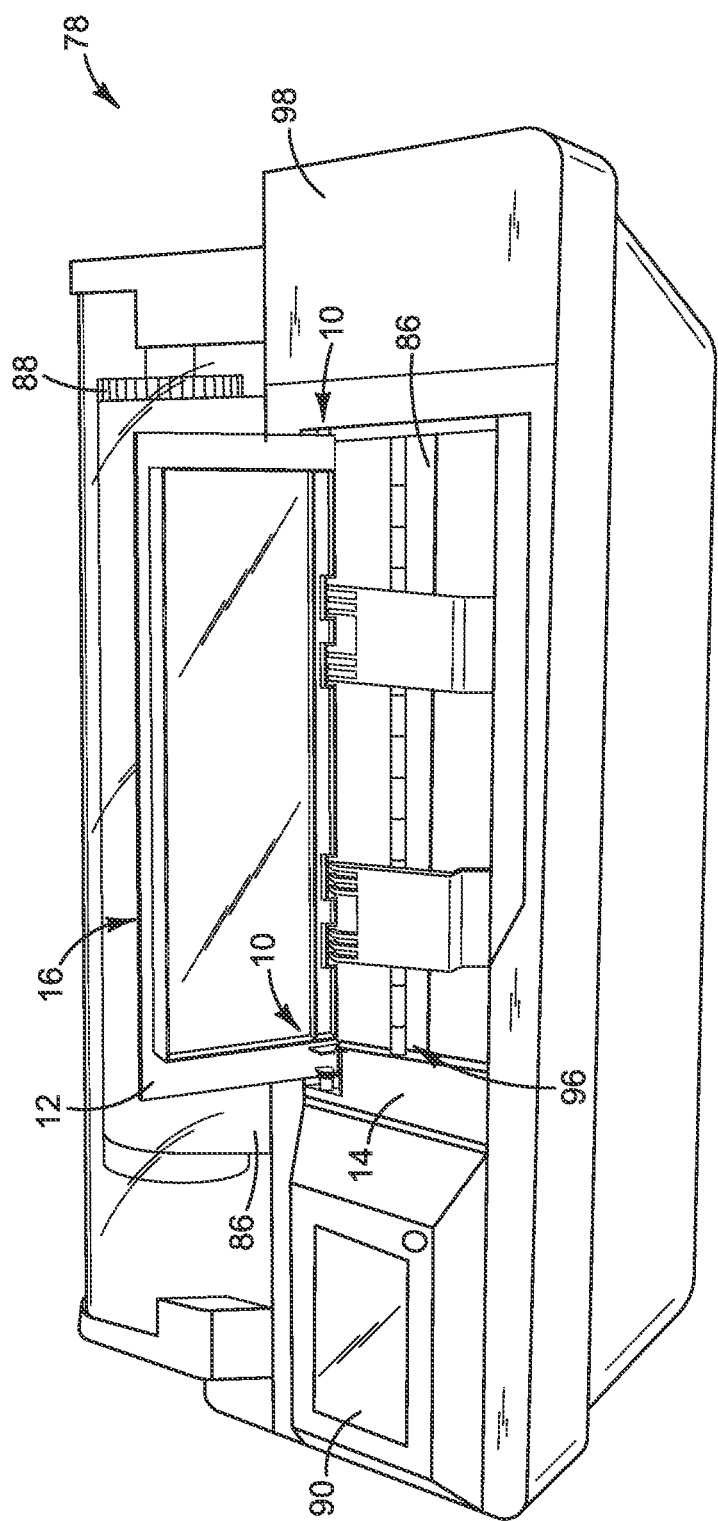
Figure 16:
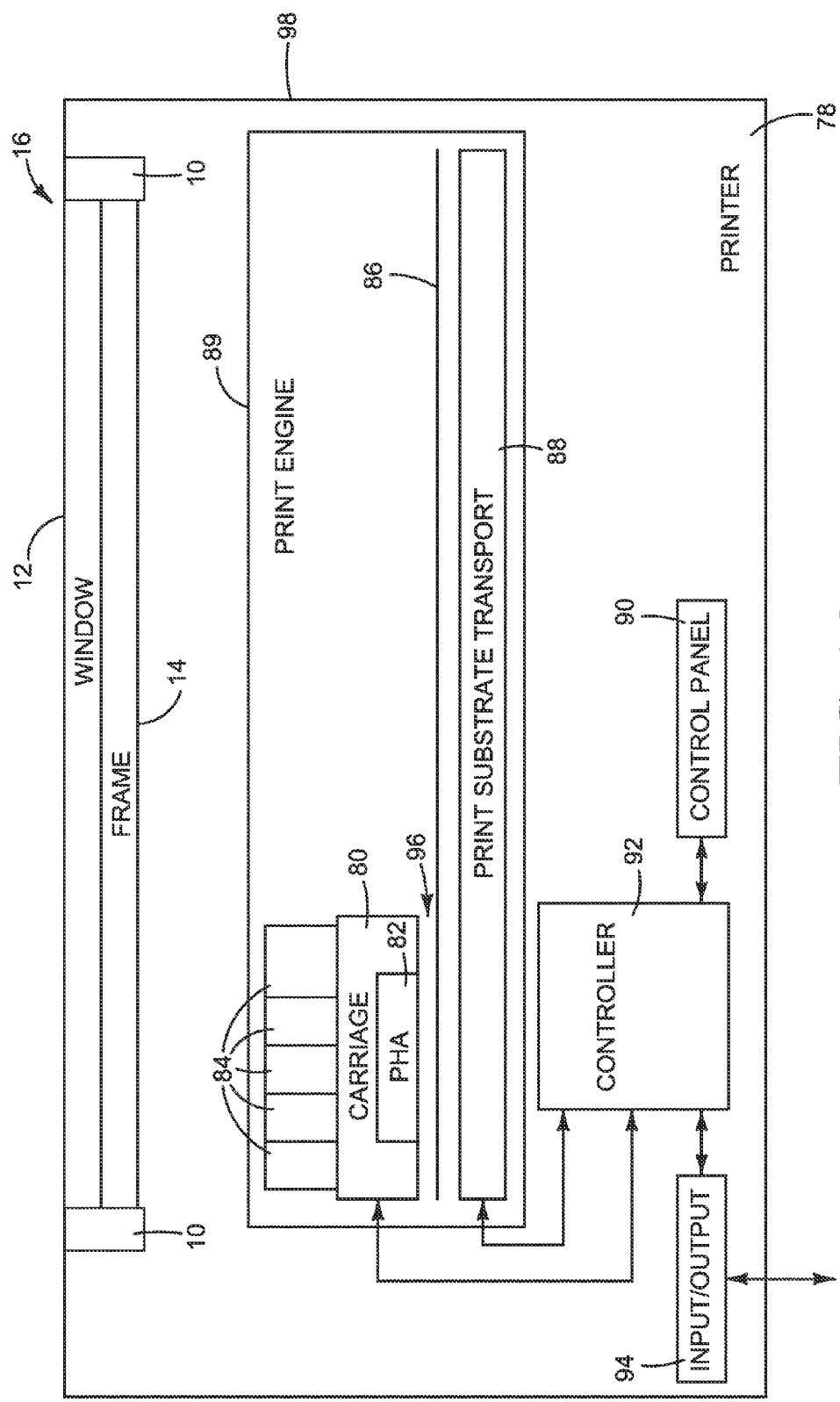

FIGS. 14 and 15 illustrate one example of a printer 78 implementing a window/frame assembly 16 such as the one shown in FIGS. 1-13. FIG. 16 is a block diagram of a printer 78. Window 12 is closed in FIG. 14 and open in FIG. 15. Referring to FIGS. 14-16, printer 78 includes a movable carriage 80 carrying a printhead assembly 82 and ink cartridges 84 that supply ink to printhead assembly 82. Printhead assembly 82 includes one or more printheads through which ink from one or more cartridges 84 is dispensed on to a web of paper other print substrate 86. A print substrate transport mechanism 88 advances print substrate 86 past carriage 80 and printhead assembly 82. Carriage 80, printhead assembly 82, and substrate transport 88 are referred to collectively as a print engine 89. An inkjet print engine 89 such as that shown in FIG. 15 is just one example for a printer 78 implementing window/frame assembly 16. Laser print engines, for example, are also possible.

Printer 78 includes a user control panel 90, a controller 92 connected to the operative components of printer 78, and an input/output device 94 through which controller 92 may communicate with external devices. Controller 92 controls the movement of carriage 80 and substrate transport 88. Controller 92 is electrically connected to printhead assembly 82 to selectively energize ink ejection elements for ejecting ink drops on to substrate 86 in a print zone 96. By coordinating the relative position of carriage 80 with substrate 86 and the ejection of ink drops, controller 92 produces the desired image on substrate 86.

Window/frame assembly 16 includes a hinge connector 10 such as the one shown in FIGS. 1-13 that connects window 12 to a frame 14 affixed to or an integral part of printer housing 98. In this implementation, window 12 is positioned over print zone 96 to allow a user to both view and access print zone 96, for example to clear a paper jam or replace an ink cartridge 84 or printhead assembly 82. While a transparent window panel 12 is shown, panel 12 could also be implemented in printer 78 as a more inexpensive, fully opaque plastic door to access print zone 76 or other areas of the printer.

As used in the Claims, "a" and "an" mean one or more.

As noted at the beginning of this Description, the examples shown in the figures and described above illustrate but do not limit the invention. Other examples may be made and implemented. Therefore, the foregoing description should not be construed to limit the scope of the invention, which is defined in the following claims.

What is claimed is:

1. A connector to connect a panel to a frame, comprising:
   first and second pins protruding from opposite sides of the panel or the frame;
   first and second receivers on opposite sides of the other of the panel or the frame to receive the first and second pins;
   a first distance between the receivers shorter than a second distance between protruding ends of the pins such that the first pin can be inserted into the first receiver and then the second pin inserted into the second receiver but both pins cannot be inserted simultaneously into the receivers; and
   a movable retainer having a first part integral to the frame and a second part integral to the panel to retain the pins in the receivers, where the first part is movable between:
      a first position to engage the second part to limit axial travel of the pins in the receivers; and
      a second position to not engage the second part to not limit axial travel of the pins in the receivers.

2. The connector of claim 1, where the first part is biased toward the first position.

3. The connector of claim 2, where the pins are round and aligned with one another along an axis so that the panel is rotatable on the pins about the axis between an open position and a closed position.

4. The connector of claim 3, where the retainer is configured to limit axial travel of the pins in the receivers throughout a full range of rotation of the panel when the first part is in the first position.

5. The connector of claim 4, where the second part includes a collar on the first pin, the collar having a groove therein extending along a circumference of the first pin and the first part extending into the groove when the first part is in the first position.

6. The connector of claim 5, where the first part includes a spring tab biased toward the first position, the spring tab having a bump thereon that extends into the groove in the collar when the first part is in the first position.

7. The connector of claim 6, where the spring tab is not accessible to be moved when the panel is in the closed position.

8. A hinge to connect a first part and a second part, comprising:
   a first pin protruding from the first part or the second part along an axis of rotation;
   a second pin protruding from the first part or the second part opposite the first pin along the axis of rotation;
   a first receiver on the other of the first part or the second part to receive the first pin;

a second receiver on the other of the first part or the second part to receive the second pin;

the pins and receivers configured with respect to one another on the parts such that the first pin can be received into the first receiver and then the second pin received into the second receiver to connect the parts but both pins cannot be received simultaneously into the receivers;

a collar on the first pin protruding from the first part or the second part; and a spring tab on the other of the first part or the second part to engage the collar, the spring tab movable between a retaining position in which the spring tab engages the collar to retain the pins in the receivers and a detached position in which the spring tab does not engage the collar to not retain the pins in the receivers, the spring tab biased toward the retaining position.

9. The hinge of claim 8, where both pins are on the first part and both receivers are on the second part.

10. The hinge of claim 8, where the collar and the spring tab in the retaining position limit axial travel of the pins in the receivers throughout a full range of rotation of the parts.

11. A printer housing having a removable panel through which an interior of the housing may be accessed, a frame supporting the panel, and a hinge removably connecting the panel to the frame, the hinge including:

first and second pins positioned opposite one another on the panel along an axis of rotation;

first and second receivers on the frame supporting the first and second pins, a first distance between the receivers shorter than a second distance between protruding ends of the pins such that the first pin can be inserted into the first receiver and then the second pin inserted into the second receiver but both pins cannot be inserted simultaneously into the receivers; and a collar on the first pin and a spring tab on the frame near the first receiver, the spring tab movable between a retained position in which the spring tab engages the collar to retain the pins in the receivers and a detached position in which the spring tab does not engage the collar to not retain the pins in the receivers, the spring tab biased toward the retained position.

12. The printer housing of claim 11, where the hinge also includes a horizontal control tab on the panel to engage a corresponding stop on the frame to control the horizontal position of at least part of the panel relative to the frame when the window is closed.

13. The printer housing of claim 11, where the hinge also includes an axial alignment fin on the panel to engage a guide slot on the frame to control the axial position of the panel as the panel is opened and closed.

* * * * *